United States Patent
Chen et al.

(10) Patent No.: US 10,833,639 B2
(45) Date of Patent: Nov. 10, 2020

(54) METHOD FOR ALIASING REDUCTION IN AUTO ZERO AMPLIFIER

(71) Applicant: Analog Devices International Unlimited Company, Limerick (IE)

(72) Inventors: Hai Chen, Gilbert, AZ (US); Gregory J. Hughes, Paradise Valley, AZ (US)

(73) Assignee: Analog Devices International Unlimited Company, Limerick (IE)

( * ) Notice: Subject to any disclaimer, the term of this patent is extended or adjusted under 35 U.S.C. 154(b) by 42 days.

(21) Appl. No.: 16/382,627

(22) Filed: Apr. 12, 2019

(65) Prior Publication Data

US 2020/0328723 A1    Oct. 15, 2020

(51) Int. Cl.
*H03F 3/45* (2006.01)
*H03F 1/56* (2006.01)

(52) U.S. Cl.
CPC ......... *H03F 3/45071* (2013.01); *H03F 1/56* (2013.01); *H03F 2200/222* (2013.01); *H03F 2200/375* (2013.01); *H03F 2200/396* (2013.01); *H03F 2200/453* (2013.01); *H03F 2203/45212* (2013.01); *H03F 2203/45681* (2013.01)

(58) Field of Classification Search
CPC ....................................................... H03F 3/45
See application file for complete search history.

(56) References Cited

U.S. PATENT DOCUMENTS 4,345,477 A * 8/1982 Johnson ............... G01L 1/2281
257/419
5,047,727 A 9/1991 Theus
5,258,664 A 11/1993 White
5,497,123 A * 3/1996 Main .................. H03D 7/1433
330/257
5,663,680 A 9/1997 Nordeng
6,271,784 B1 8/2001 Lynn et al.
6,653,895 B1 11/2003 Botker
(Continued)

FOREIGN PATENT DOCUMENTS

| EP | 0433383 B1 | 10/1994 |
|---|---|---|
| EP | 2363953 B1 | 10/2012 |
| EP | 1992067 B1 | 4/2017 |
| EP | 2779444 B1 | 12/2017 |

OTHER PUBLICATIONS

Kugelstadt, Thomas, "Auto-zero amplifiers ease the design of high-precision circuits", Analog Applications Journal, Texas Instruments Inc., (2005), 10 pgs.

(Continued)

*Primary Examiner* — Patricia T Nguyen
(74) *Attorney, Agent, or Firm* — Schwegman Lundberg & Woessner, P.A.

(57) ABSTRACT

An electronic circuit comprises a primary amplifier circuit including a differential input and an output, an offset nulling amplifier circuit, and an impedance matching circuit. The offset nulling amplifier circuit includes a differential input and an output. The differential input of the primary amplifier circuit is operatively coupled to a differential input of the offset nulling amplifier circuit and the impedance matching circuit. The output of the offset nulling amplifier circuit is operatively coupled to the primary amplifier circuit and provides a voltage to reduce offset in an output signal of the primary amplifier circuit.

20 Claims, 2 Drawing Sheets

(56) References Cited

U.S. PATENT DOCUMENTS

| | | | |
|---|---|---|---|
| 8,493,139 B2 | 7/2013 | Sayuk | |
| 8,698,556 B2 | 4/2014 | Rosca | |
| 9,444,414 B2 | 9/2016 | Peluso | |
| 2008/0018392 A1* | 1/2008 | Nolan | H03F 3/45986 330/9 |
| 2008/0042742 A1* | 2/2008 | Linder | H03F 1/22 327/562 |
| 2008/0079413 A1* | 4/2008 | Ashburn | G05F 3/30 323/313 |
| 2009/0009240 A1* | 1/2009 | Takemoto | H03F 1/26 330/9 |
| 2012/0249243 A1* | 10/2012 | Rosca | H03F 3/45955 330/253 |

OTHER PUBLICATIONS

Mohimi, Reza, "To Chop or Auto-Zero: That Is the Question", Analog Devices Technical Article, MS-2062, (Jun. 2011), 6 pgs.

Moghimi, Reza, "Zero-Drift Operational Amplifiers", Analog Dialog 44-03 Back Burner, (Mar. 2010), 2 pgs.

Nolan, Eric, et al., "Demystifying Auto-Zero Amplifiers—2", Analog Dialogue 34-3, (2000), 2 pgs.

Nolan, Eric, "Demystifying Auto-Zero Amplifiers—Part 1", Analog Dialogue 34-2, (2000), 3 pgs.

\* cited by examiner

METHOD FOR ALIASING REDUCTION IN AUTO ZERO AMPLIFIER

FIELD OF THE DISCLOSURE

This document relates to integrated circuits and in particular to auto-zero amplifier circuits.

BACKGROUND

Amplifier circuits are typically used in circuit designs to add gain to electrical signals input to the amplifier circuits. Some amplifier circuits receive a differential input signal and generate an output signal that applies the gain to the differential input signal. Performance of amplifier circuits can be sensitive to an input offset between the differential inputs. The offset may bias the output signal toward a circuit supply rail or ground rail and cause clipping in the output signal or clipping in circuits downstream from the amplifier circuit. This can reduce the dynamic range of the amplifier circuit.

SUMMARY OF THE DISCLOSURE

This document relates generally to amplifier circuits. In some aspects, an electronic circuit includes a primary amplifier circuit, an offset nulling amplifier circuit and an impedance matching circuit. The primary amplifier circuit includes a differential input and an output. The offset nulling amplifier circuit includes a differential input and an output. The differential input of the primary amplifier circuit is operatively coupled to a differential input of the offset nulling amplifier circuit and the impedance matching circuit. The output of the offset nulling amplifier circuit is operatively coupled to the primary amplifier circuit and provides a voltage to reduce offset in an output signal of the primary amplifier circuit.

In some aspects, a method of operating an amplifier circuit includes applying an input signal to a primary amplifier circuit, applying the input signal to an input of an offset nulling amplifier circuit and an input of an impedance matching circuit, and using an output of the offset nulling amplifier circuit to reduce an offset voltage in an output signal of the primary amplifier circuit.

In some aspects, an auto-zero amplifier circuit includes a primary amplifier circuit, a sample and hold circuit, an offset nulling amplifier circuit, and a replicate circuit. The primary amplifier circuit includes a differential input configured to receive a differential input signal. The offset nulling amplifier circuit includes a differential input and an output, the differential input and the output connected to the sample and hold circuit. The replicate circuit is a replicate of a portion of the offset nulling amplifier circuit, and the replicate circuit is connected to the sample and hold circuit. The sample and hold circuit is configured to sample an input offset voltage of the offset nulling amplifier circuit and reduce an offset of the primary amplifier circuit using the sampled input offset voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The dynamic range of amplifier circuits can be reduced by an offset voltage present on the differential inputs. Auto-zero amplifier circuits are designed to reduce or remove any offset between the inputs to the amplifier circuit. Some types of auto-zero amplifier circuits sample the offset voltage and remove the offset in the processing of the input signal. However, the sampling operation of the circuits may introduce aliasing effects that may inject unwanted signal components into the output signal. The aliasing can be caused by imbalances in input impedance.

Figure 1:
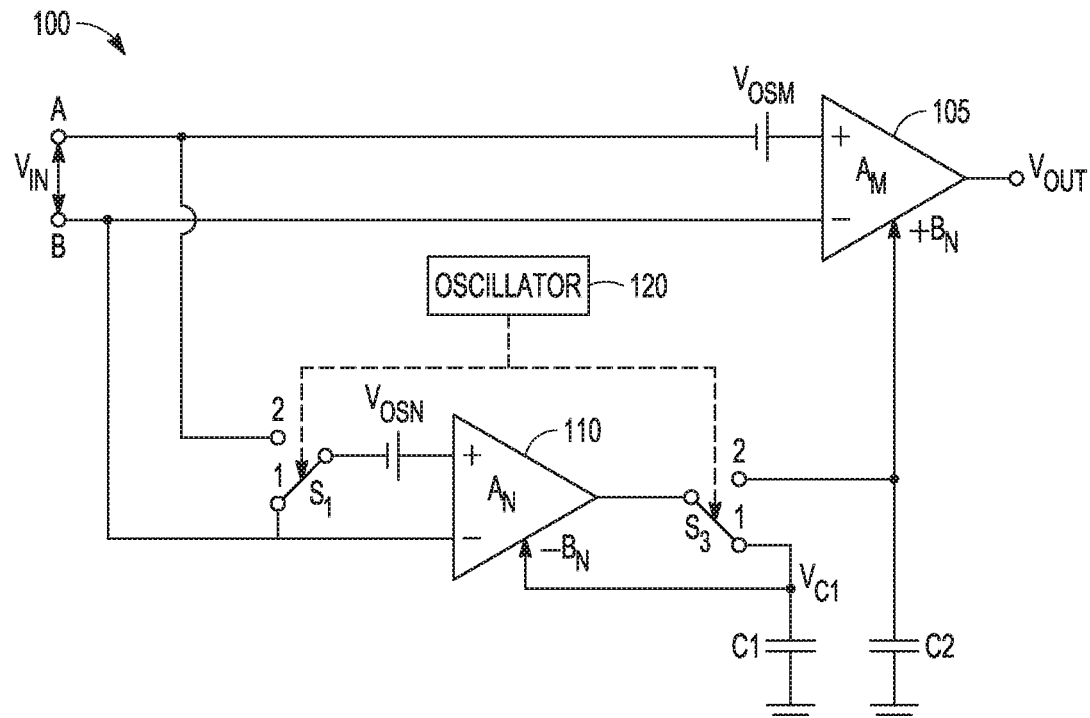
FIG. 1 is a block diagram of an example of portions of an amplifier circuit.

FIG. 1 is a circuit schematic of an example of an auto-zero amplifier circuit 100. The auto-zero amplifier circuit 100 includes a primary or main amplifier circuit 105 and an offset nulling amplifier circuit 110. The primary amplifier circuit 105 performs the primary signal processing on the input signal $V_{IN}$ to generate the output signal. The offset nulling amplifier circuit 110 is used to capture the offset voltage which applied to the primary amplifier circuit 105 to reduce or remove (auto-zero) the offset from the generated output signal.

The auto-zero amplifier circuit 100 also includes a sample and hold circuit. The sample and hold circuit includes the oscillator circuit 120 and can include input switch circuits and output switch circuits. The switch circuits can include pass gates, such as one or both of n-type field effect transistors (NFETs) and p-type field effect transistors (or PFETs). The oscillator circuit 120 generates a sampling signal that includes a first phase (or sampling phase) and a second phase (or active phase). The phases are used to activate (or turn ON) and deactivate (or turn OFF) the switch circuits to perform the auto zeroing.

As shown in FIG. 1, during the second phase (phase 2), the positive and negative inputs of the offset nulling amplifier circuit 110 are electrically connected to the positive and negative inputs of the primary amplifier circuit 105. The input of $V_{IN}$ labeled "A" sees an impedance that is due to the circuit paths to the positive inputs of the primary amplifier circuit 105 and the offset nulling amplifier circuit 110. The input of V labeled "B" sees an impedance that is due to the circuit paths to the negative inputs of the primary amplifier circuit 105 and the offset nulling amplifier circuit 110. Thus, the circuit paths of input A and input B of $V_{IN}$ have about the same impedance.

However, during the first phase (phase 1), the input paths are unbalanced regarding impedance. In phase 1, input switch circuit S1 disconnects input A from the input of the offset nulling amplifier circuit 110. Input A only sees the load of the positive input of the primary amplifier circuit 105. In phase 1, S also connects input B to both inputs of the offset nulling amplifier circuit 110. Input B sees the load of the negative input of the primary amplifier circuit 105 and the load of both of the inputs of the offset nulling amplifier circuit 110. Thus, the input impedance is changing between phase 1 and phase 2. This imbalance in the impedance can introduce aliasing into the output signal of the primary amplifier circuit 105.

Figure 2:
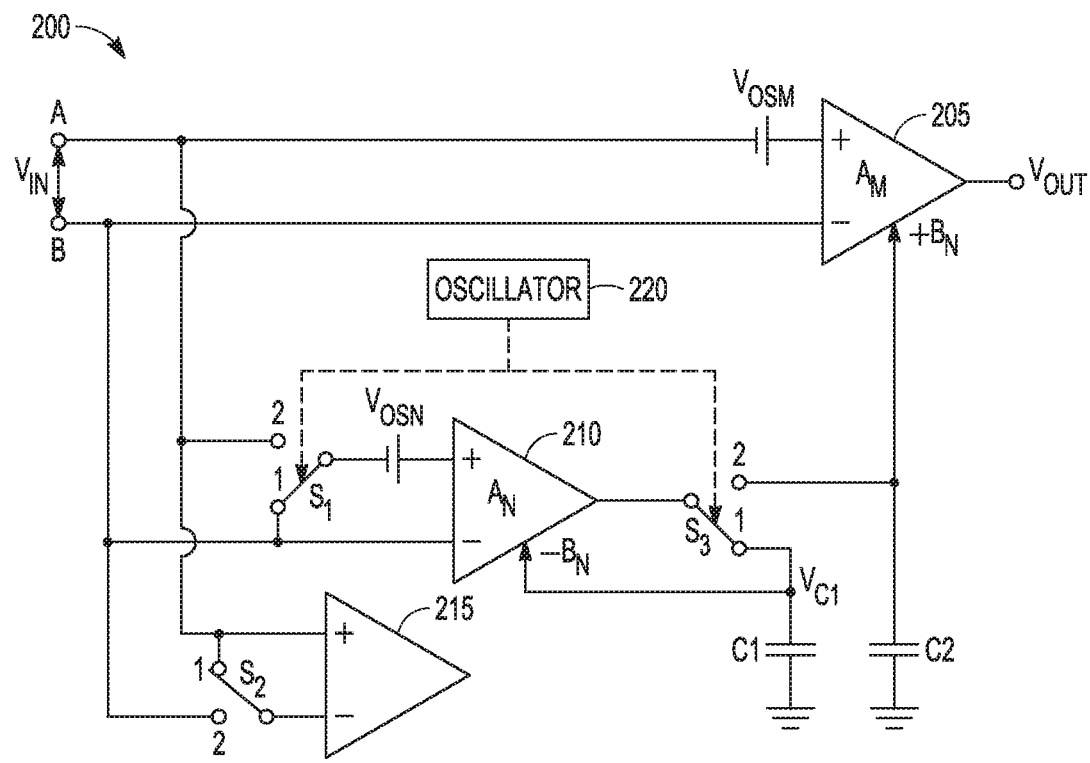
FIG. 2 is a circuit schematic of an example of portions of an auto-zero amplifier circuit.

FIG. 2 is a circuit schematic of an example of an auto-zero amplifier circuit 200. The auto-zero amplifier circuit 200 includes a primary amplifier circuit 205, an offset nulling amplifier circuit, and a sample and hold circuit. The auto-zero amplifier circuit 200 also includes an impedance matching circuit 215. The impedance matching circuit 215 is added to the input circuit paths to balance the impedance between the sampling phase (phase 1) and the active phase (phase 2).

The impedance matching circuit can be a replicate of a portion of the offset nulling amplifier circuit 210. In some aspects, the offset nulling amplifier circuit 210 includes a differential input operatively coupled to a differential input transistor pair, and the impedance matching circuit includes a replicate circuit of the differential input transistor pair of the offset nulling amplifier circuit 210.

Figure 3:
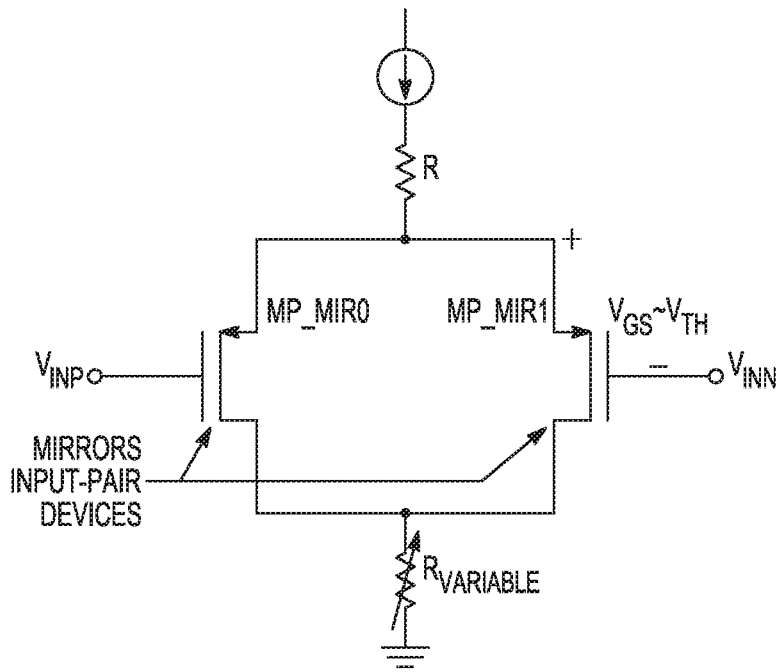
FIG. 3 is a circuit schematic of an example of a differential input transistor pair.

FIG. 3 is a circuit schematic of an example of a differential input transistor pair showing the connection to a differential input ($V_{INP}$, $V_{INN}$). Both the offset nulling amplifier and the impedance matching circuit have a differential input connected to the transistor pair.

Returning to FIG. 2, the sampling phase and the active phase are phases of a sampling clock signal provided by the oscillator circuit 220. The frequency of the sampling clock signal is less than a frequency of an alternating current (AC) component of an input common mode signal of the primary amplifier circuit. The sample and hold circuit includes input switch circuits S1 and S2. The inputs of the impedance matching circuit are connected to the sample and hold circuit using input switch circuit S2. During the first or sampling phase, the second or negative input of the primary amplifier circuit 205 is connected to both inputs of the offset nulling amplifier circuit 210 using the first input switch S1. Also, the first or positive input of the primary amplifier circuit 205 is connected to both inputs of the impedance matching circuit 215. Thus, both input A and input B are connected to one input of the primary amplifier circuit 205, and two inputs of a differential input transistor pair; input A to the transistor pair of the impedance matching circuit and input B to the transistor pair of the offset nulling amplifier. Because the differential input transistor pairs are matched, input A and input B see the same impedance during phase 1.

During phase 2, input A is connected to the positive input of the primary amplifier circuit 205, the offset nulling amplifier circuit 210, and the impedance matching circuit 215. Input B is connected to the negative input of the primary amplifier circuit 205, the offset nulling amplifier circuit 210 and the impedance matching circuit 215. Again, because the differential input transistor pairs of the offset nulling amplifier and the impedance matching circuit are matched, input A and input B see the same impedance during phase 2.

The sample and hold circuit can include an output switch circuit S3. During the sampling phase, a nulling voltage is sampled. This nulling voltage is representative of the offset voltage between inputs of the offset nulling amplifier circuit 210. In some aspects, the sample and hold circuit includes a capacitor C1 connected to output switch S3 and the output of the nulling amplifier circuit. In the sampling phase, S3 stores the nulling voltage.

During the active phase, the sampled nulling voltage is applied to the primary amplifier circuit to reduce the input offset voltage of the primary amplifier circuit. The offset voltage of the primary amplifier is sampled. In some aspects, the sample and hold circuit includes capacitor C2 to store the offset voltage of the primary amplifier circuit 205. The voltage stored on C1 adjusts for the offset of the nulling amplifier during the active phase. The overall offset voltage determined from C1 and C2 is then applied to the primary amplifier while the input signal is processed.

Figure 4:
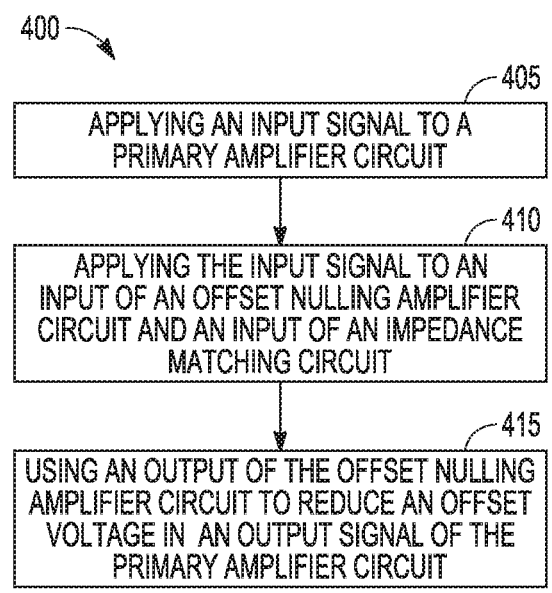
FIG. 4 is an example of a method of operating an amplifier circuit.

For completeness, FIG. 4 is an example of a method of operating an amplifier circuit. The amplifier circuit includes a primary amplifier circuit, an offset nulling amplifier circuit, and an impedance matching circuit. The method reduces or removes the input offset voltage of the primary amplifier circuit. At 405, an input signal is applied to the primary amplifier circuit. At 410, the input signal is also applied to the input of the offset nulling amplifier circuit and the input of the impedance matching circuit. At 415, the output of the offset nulling amplifier circuit is used to reduce an offset voltage in the output signal of the primary amplifier circuit.

The devices, systems and methods described herein provide auto-zeroing of an input offset voltage to an amplifier while reducing effects of aliasing.

Additional Description and Aspects

Aspect 1 can include subject matter, such as an electronic circuit, comprising a primary amplifier circuit, an offset nulling amplifier circuit, and an impedance matching circuit. The primary amplifier circuit includes a differential input and an output. The offset nulling amplifier circuit includes a differential input and an output. The differential input of the primary amplifier circuit is operatively coupled to a differential input of the offset nulling amplifier circuit and the impedance matching circuit. The output of the offset nulling amplifier circuit is operatively coupled to the primary amplifier circuit and provides a voltage to reduce offset in an output signal of the primary amplifier circuit.

In Aspect 2, the subject matter of Aspect 1 optionally includes an offset nulling amplifier circuit that includes a differential input operatively coupled to a differential input transistor pair, and an impedance matching circuit that includes a replicate circuit of the differential input transistor pair of the offset nulling amplifier circuit and a differential input connected to the replicate circuit.

In Aspect 3, the subject matter of Aspect 2 optionally includes an oscillator circuit configured to produce a signal having a first phase and a second phase; a first input switch circuit configured to connect a second input of the differential input of the primary amplifier circuit to both inputs of the differential input of the offset nulling amplifier during the first phase, and connect a first input of the primary amplifier circuit to a first input of the differential input of the offset nulling amplifier during the second phase; and a second input switch circuit configured to connect a first input of the differential input of the primary amplifier circuit to both inputs of the differential input of the impedance matching circuit during the first phase, and connect the second input of the primary amplifier circuit to a second input of the differential input of the impedance matching circuit during the second phase.

In Aspect 4, the subject matter of one or both of Aspects 1 and 2 optionally includes an oscillator circuit configured to produce a signal having a first phase and a second phase; and an output switch circuit configured to: during a first phase, sample a nulling voltage representative of an offset voltage between input of the differential input of the offset nulling amplifier circuit; and during a second phase, applying the nulling voltage to an output stage of the primary amplifier circuit to reduce the input offset voltage of the primary amplifier circuit.

In Aspect 5, the subject matter of Aspect 4 optionally includes a first input switch circuit configured to, during the first phase, connect inputs of the differential input of the nulling amplifier circuit to a second output of the primary amplifier circuit and, during the second phase, change a connection of a first input of the differential input of the offset nulling amplifier circuit to the first input of the primary amplifier circuit; and a second input switch circuit configured to, during the first phase, connect inputs of the differential input of the impedance matching circuit to a first input of the primary amplifying circuit and, during the second phase, change a connection of a second input of the inputs of the impedance matching circuit to a second input of the primary amplifier circuit.

In Aspect 6, the subject matter of one or both of Aspects 4 and 5 optionally includes a first capacitor operatively coupled to the output switch and the nulling amplifier circuit, the first capacitor to store the nulling voltage during the first phase; and a second capacitor operatively coupled to the output switch and the primary amplifier circuit, the second capacitor to receive an input offset voltage of the primary amplifier circuit during the second phase.

In Aspect 7, the subject matter of one or any combination of Aspects 4-6 optionally includes an oscillator circuit in which a frequency of the signal having the first phase and the second phase is less than a frequency of an alternating current (AC) component of an input common mode signal of the primary amplifier circuit.

Aspect 8 can include subject matter (such as a method of operating an amplifier circuit), or can optionally be combined with one or any combination of Aspects 1-7 to include such subject matter, comprising applying an input signal to a primary amplifier circuit; applying the input signal to an input of an offset nulling amplifier circuit and an input of an impedance matching circuit; and using an output of the offset nulling amplifier circuit to reduce an offset voltage in an output signal of the primary amplifier circuit.

In Aspect 9, the subject matter of Aspect 8 optionally includes applying the input signal to inputs of a differential transistor pair that is a replicate of a differential input transistor pair of the offset nulling amplifier circuit.

In Aspect 10, the subject matter of Aspect 9 optionally includes in a first phase, connecting a first input of the primary amplifier circuit to the inputs of the differential transistor pair of the impedance measuring circuit, and connecting a second input of the primary amplifier circuit to both inputs of the differential input transistor pair of the offset nulling amplifier circuit; and in a second phase, connecting the first input of the primary amplifier circuit to a first input of the offset nulling amplifier and a first input of the differential transistor pair of the impedance matching circuit, and connecting the second input of the primary amplifier circuit to a second input of the offset nulling amplifier circuit and a second input of the differential transistor pair of the impedance matching circuit.

In Aspect 11, the subject matter of Aspect 9 optionally includes during a first phase, determining an offset voltage between inputs of the differential input of the offset nulling amplifier circuit; and during a second phase, applying the determined offset voltage to the primary amplifier circuit to cancel an input offset voltage of the primary amplifier circuit.

In Aspect 12, the subject matter of Aspect 11 optionally includes during the first phase, connecting the inputs of the impedance matching circuit to a first input of the primary amplifier circuit, and connecting inputs of the offset nulling amplifier circuit to a second input of the primary amplifier circuit; and during the second phase, changing a connection of a first input of the inputs of the offset nulling amplifier circuit to the first input of the primary amplifier circuit, and changing a connection of a second input of the inputs of the impedance matching circuit to a second input of the primary amplifier circuit.

In Aspect 13, the subject matter of Aspect 11 optionally includes during the first phase, storing the offset voltage of the offset nulling amplifier circuit onto a first capacitor; and during the second phase storing a voltage on a second capacitor to correct the offset voltage of the primary amplifier circuit.

Aspect 14 includes subject matter (such as an auto-zero amplifier circuit) or can optionally be combined with one or any combination of Aspects 1-13 to include such subject matter comprising: a primary amplifier circuit including a differential input configured to receive a differential input signal; a sample and hold circuit; an offset nulling amplifier circuit including a differential input and an output, the differential input and the output connected to the sample and hold circuit; and a replicate circuit of a portion of the offset nulling amplifier circuit, the replicate circuit connected to the sample and hold circuit; wherein the sample and hold circuit is configured to sample an input offset voltage of the offset nulling amplifier circuit and reduce an offset of the primary amplifier circuit using the sampled offset voltage.

In Aspect 15, the subject matter of Example 14 optionally includes an offset nulling amplifier circuit includes a differential input transistor pair connected to the differential input of the offset nulling amplifier circuit, and the replicate circuit is a replicate of the differential input transistor pair and includes a differential input.

In Aspect 16, the subject matter of Aspect 15 optionally includes a sample and hold circuit configured to sample an offset voltage between inputs of the differential input of the offset nulling amplifier circuit during a sampling phase and apply the sampled offset to the primary amplifier circuit during an active phase.

In Aspect 17, the subject matter of Aspect 16 optionally includes a sample and hold circuit configured to, during the sampling phase, connect the differential inputs of the offset nulling amplifier together to a negative input of the primary amplifier circuit; connect the differential inputs of the replicate circuit together to a positive input of the primary amplifier circuit; and sample a nulling voltage at the output of the offset nulling amplifier circuit.

In Aspect 18, the subject matter of one or both of Aspects 16 and 17 optionally includes a sample and hold circuit configured to, during the active phase, connect positive differential inputs of the offset nulling amplifier circuit and the replicate circuit to a positive differential input of the primary amplifier circuit, and connect negative differential inputs of the offset nulling amplifier circuit and the replicate circuit to a negative differential input of the primary amplifier circuit; and apply the nulling voltage to the primary amplifier circuit to reduce the offset of the primary amplifier circuit.

In Aspect 19, the subject matter of Aspect 16 optionally includes a sample and hold circuit configured to store the offset voltage of the offset nulling amplifier circuit onto a first capacitor during the sampling phase; and connect the output of the offset nulling amplifier circuit to a second capacitor and to the primary amplifier circuit during the active phase.

In Aspect 20, the subject matter of one or any combination of Aspects 16-19 optionally includes a frequency of the sampling phase and the active phase of the sample and hold circuit being less than a frequency of an alternating current (AC) component of an input common mode signal of the primary amplifier circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
    a primary amplifier circuit including a differential input and an output;
    an offset nulling amplifier circuit, wherein the offset nulling amplifier circuit includes a differential input and an output; and
    an impedance matching circuit, wherein the differential input of the primary amplifier circuit is operatively coupled to a differential input of the offset nulling amplifier circuit and the impedance matching circuit;
    wherein the output of the offset nulling amplifier circuit is operatively coupled to the primary amplifier circuit and provides a voltage to reduce offset in an output signal of the primary amplifier circuit.

2. The electronic circuit of claim 1, wherein the offset nulling amplifier circuit includes a differential input operatively coupled to a differential input transistor pair and the impedance matching circuit includes a replicate circuit of the differential input transistor pair of the offset nulling amplifier circuit and a differential input connected to the replicate circuit.

3. The electronic circuit of claim 2, including:
    an oscillator circuit configured to produce a signal having a first phase and a second phase;
    a first input switch circuit configured to connect a second input of the differential input of the primary amplifier circuit to both inputs of the differential input of the offset nulling amplifier during the first phase, and connect a first input of the primary amplifier circuit to a first input of the differential input of the offset nulling amplifier during the second phase; and
    a second input switch circuit configured to connect a first input of the differential input of the primary amplifier circuit to both inputs of the differential input of the impedance matching circuit during the first phase, and connect the second input of the primary amplifier circuit to a second input of the differential input of the impedance matching circuit during the second phase.

4. The electronic circuit of claim 2, including:
    an oscillator circuit configured to produce a signal having a first phase and a second phase; and
    an output switch circuit configured to:
        during a first phase, sample a nulling voltage representative of an offset voltage between input of the differential input of the offset nulling amplifier circuit; and
        during a second phase, applying the nulling voltage to an output stage of the primary amplifier circuit to reduce the input offset voltage of the primary amplifier circuit.

5. The electronic circuit of claim 4, including:
    a first input switch circuit configured to, during the first phase, connect inputs of the differential input of the nulling amplifier circuit to a second output of the primary amplifier circuit and, during the second phase, change a connection of a first input of the differential input of the offset nulling amplifier circuit to the first input of the primary amplifier circuit; and
    a second input switch circuit configured to, during the first phase, connect inputs of the differential input of the impedance matching circuit to a first input of the primary amplifying circuit and, during the second phase, change a connection of a second input of the inputs of the impedance matching circuit to a second input of the primary amplifier circuit.

6. The electronic circuit of claim 4, including:
a first capacitor operatively coupled to the output switch and the nulling amplifier circuit, the first capacitor to store the nulling voltage during the first phase; and
a second capacitor operatively coupled to the output switch and the primary amplifier circuit, the second capacitor to receive an input offset voltage of the primary amplifier circuit during the second phase.

7. The electronic circuit of claim 4, wherein a frequency of the signal having the first phase and the second phase is less than a frequency of an alternating current (AC) component of an input common mode signal of the primary amplifier circuit.

8. A method of operating an amplifier circuit, the method comprising:
applying an input signal to a primary amplifier circuit;
applying the input signal to an input of an offset nulling amplifier circuit and an input of an impedance matching circuit; and
using an output of the offset nulling amplifier circuit to reduce an offset voltage in an output signal of the primary amplifier circuit.

9. The method of claim 8, wherein applying the input signal to the input of the impedance matching circuit includes applying the input signal to inputs of a differential transistor pair that is a replicate of a differential input transistor pair of the offset nulling amplifier circuit.

10. The method of claim 9, wherein applying the input signal to the input of the offset nulling amplifier circuit includes:
in a first phase, connecting a first input of the primary amplifier circuit to the inputs of the differential transistor pair of the impedance measuring circuit, and connecting a second input of the primary amplifier circuit to both inputs of the differential input transistor pair of the offset nulling amplifier circuit; and
in a second phase, connecting the first input of the primary amplifier circuit to a first input of the offset nulling amplifier and a first input of the differential transistor pair of the impedance matching circuit, and connecting the second input of the primary amplifier circuit to a second input of the offset nulling amplifier circuit and a second input of the differential transistor pair of the impedance matching circuit.

11. The method of claim 9, wherein using the output of the offset nulling amplifier circuit to reduce offset in the output signal of the primary amplifier circuit includes:
during a first phase, determining an offset voltage between inputs of the differential input of the offset nulling amplifier circuit; and
during a second phase, applying the determined offset voltage to the primary amplifier circuit to cancel an input offset voltage of the primary amplifier circuit.

12. The method of claim 11, including:
during the first phase, connecting the inputs of the impedance matching circuit to a first input of the primary amplifier circuit, and connecting inputs of the offset nulling amplifier circuit to a second input of the primary amplifier circuit; and
during the second phase, changing a connection of a first input of the inputs of the offset nulling amplifier circuit to the first input of the primary amplifier circuit, and changing a connection of a second input of the inputs of the impedance matching circuit to a second input of the primary amplifier circuit.

13. The method of claim 11, including:
during the first phase, storing the offset voltage of the offset nulling amplifier circuit onto a first capacitor; and
during the second phase storing a voltage on a second capacitor to correct the offset voltage of the primary amplifier circuit.

14. An auto-zero amplifier circuit comprising:
a primary amplifier circuit including a differential input configured to receive a differential input signal;
a sample and hold circuit;
an offset nulling amplifier circuit including a differential input and an output, the differential input and the output connected to the sample and hold circuit; and
a replicate circuit of a portion of the offset nulling amplifier circuit, the replicate circuit connected to the sample and hold circuit;
wherein the sample and hold circuit is configured to sample an input offset voltage of the offset nulling amplifier circuit and reduce an offset of the primary amplifier circuit using the sampled offset voltage.

15. The auto-zero amplifier circuit of claim 14, wherein the offset nulling amplifier circuit includes a differential input transistor pair connected to the differential input of the offset nulling amplifier circuit, and the replicate circuit is a replicate of the differential input transistor pair and includes a differential input.

16. The auto-zero amplifier circuit of claim 15, wherein the sample and hold circuit is configured to sample an offset voltage between inputs of the differential input of the offset nulling amplifier circuit during a sampling phase and apply the sampled offset to the primary amplifier circuit during an active phase.

17. The auto-zero amplifier circuit of claim 16, wherein during the sampling phase, the sample and hold circuit is configured to:
connect the differential inputs of the offset nulling amplifier together to a negative input of the primary amplifier circuit;
connect the differential inputs of the replicate circuit together to a positive input of the primary amplifier circuit; and
sample a nulling voltage at the output of the offset nulling amplifier circuit.

18. The auto-zero amplifier circuit of claim 16, wherein during the active phase, the sample and hold circuit is configured to:
connect positive differential inputs of the offset nulling amplifier circuit and the replicate circuit to a positive differential input of the primary amplifier circuit, and connect negative differential inputs of the offset nulling amplifier circuit and the replicate circuit to a negative differential input of the primary amplifier circuit; and
apply the nulling voltage to the primary amplifier circuit to reduce the offset of the primary amplifier circuit.

19. The auto-zero amplifier circuit of claim 16, wherein the sample and hold circuit is configured to:
store the offset voltage of the offset nulling amplifier circuit onto a first capacitor during the sampling phase; and
connect the output of the offset nulling amplifier circuit to a second capacitor and to the primary amplifier circuit during the active phase.

20. The auto-zero amplifier circuit of claim 16, wherein a frequency of the sampling phase and the active phase of the sample and hold circuit is less than a frequency of an alternating current (AC) component of an input common mode signal of the primary amplifier circuit.

* * * * *